United States Patent [19]
Schmitt

[11] Patent Number: 6,005,770
[45] Date of Patent: Dec. 21, 1999

[54] COMPUTER AND A SYSTEM AND METHOD FOR COOLING THE INTERIOR OF THE COMPUTER

[75] Inventor: Ty Schmitt, Round Rock, Tex.

[73] Assignee: Dell U.S.A., L.P., Round Rock, Tex.

[21] Appl. No.: 08/968,274

[22] Filed: Nov. 12, 1997

[51] Int. Cl.⁶ .................................................. H05K 7/20
[52] U.S. Cl. .......................... 361/695; 361/687; 454/184
[58] Field of Search .................................... 415/177, 178, 415/213.1, 214.1; 454/184; 165/80.3, 122–126; 361/687, 690, 694, 695, 717–719

[56] References Cited

U.S. PATENT DOCUMENTS

| | | | |
|---|---|---|---|
| 5,006,959 | 4/1991 | Freige | 361/695 |
| 5,210,680 | 5/1993 | Scheibler | 361/695 |
| 5,277,658 | 1/1994 | Goettl | 454/259 |
| 5,438,226 | 8/1995 | Kuchta . | |
| 5,460,441 | 10/1995 | Hastings | 361/684 |
| 5,484,012 | 1/1996 | Hiratsuka | 361/695 |
| 5,546,272 | 8/1996 | Moss et al. . | |
| 5,572,403 | 11/1996 | Mills . | |
| 5,694,294 | 12/1997 | Ohashi | 361/695 |
| 5,793,610 | 8/1998 | Schmitt | 361/695 |

*Primary Examiner*—Gerald Tolin
*Attorney, Agent, or Firm*—Haynes and Boone, L.L.P.

[57] ABSTRACT

A computer and a system and method of cooling the interior of the computer wherein at least two fans are disposed in the interior of the computer and are operated simultaneously. At least one horizontally extending louver is provided on each fan so that, if one of the fans fails, the flow of air through the other fan is blocked by its louver to prevent interference with the air flow through the other fan.

10 Claims, 2 Drawing Sheets

COMPUTER AND A SYSTEM AND METHOD FOR COOLING THE INTERIOR OF THE COMPUTER

TECHNICAL FIELD

The present disclosure is directed, in general, to a system and method for cooling a computer and a computer employing such a system, and, more particularly, to such a system, method, and computer in which one or more cooling fans are provided in the interior of the computer for cooling components in the interior.

BACKGROUND

As computers grow in speed and shrink in size, power consumed within the computer per unit volume (power density) increases dramatically. Thus, it becomes essential to dissipate the heat generated by components within the computer during operation to ensure that the components remain within their normal operating temperature ranges, since otherwise the components will fail immediately or will have too short a lifetime.

One of the most effective techniques of dissipating heat from a component of a computer is to directly apply a relatively high velocity air flow across the surface of the component to force cool the component. This raises the convective heat transfer coefficient for the surface of that component, thereby increasing the convection cooling. Most computers are provided with fans to promote force cooling, thus increasing the temperature differential between the surface of the component and the surrounding air to increase the efficiency of the heat transfer.

Of all components in a computer, the microprocessor central processing unit ("CPU") liberates the most heat during operation of the computer. It has therefore become common practice to provide a heat sink for the CPU to increase the heat-dissipating surface area for more effective cooling. In addition to the heat sink associated with the CPU, a dedicated CPU cooling fan is often used to provide force cooling and air exchange to dissipate the heat generated by the CPU. Typically, such a fan-based system incorporates a small, axial, box fan driven by a motor.

Although a fan-based system provides effective component cooling, it has draw-backs. For example, if the fan fails or locks up, there is no way to cool the CPU of the computer because there is no back-up capability. Thus the CPU may overheat causing destruction of the CPU and computer failure. A viable solution in this regard is to incorporate a secondary, redundant fan to protect the components of the computer from overheating should the primary fan fail. The redundant fan is usually designed to run continuously with the primary fan while the computer is in standard operation since it has the advantage of offering additional cooling while simultaneously fulfilling the ultimate objective for implementing the other fan.

In these arrangements, each fan moves a portion of the air being used for cooling, and the design is usually such that the total cooling capacity of the fans is greater than minimally necessary to cool the computer. Thus if a single fan fails, the airflow created by the remaining functioning fan or fans is intended to be sufficient to cool the system. However, according to these designs, if one fan fails the airflow pattern is changed since air will continue to move past the heat generating components near the fans still operating. However, the airflow past the components closest to the failing fan may be considerably reduced, or may even be reversed due to back pressures, thus creating hot spots and interfering with the air flow through the operating fans.

Accordingly, what is needed is a computer having an internal fan-based cooling system in which a single fan failure does not unduly compromise air exchange or directionality of air flow, thereby maintaining effective force-cooling of specified components.

SUMMARY

To this end, according to the computer, system, and method of the present invention, at least two fans are disposed in the interior of the computer and are operated simultaneously. If one of the fans fails, the flow of air through it is blocked to prevent interference with the air flow through the other fan.

According to a feature of the disclosure, the air flow is blocked by at least one horizontally extending louver is pivotally mounted to the fan for movement between a horizontal open position in which it permits air flow through the fan to distribute air over at least one of the components and a vertical closed position in which it blocks air flow through the fan.

Advantages are thus obtained by the computer, the system and the method of the present disclosure since a single fan failure does not unduly compromise air exchange or directionality of air flow, thereby maintaining effective force-cooling of specified components.

DETAILED DESCRIPTION OF THE PREFERRED EMBODIMENT

Figure 1:
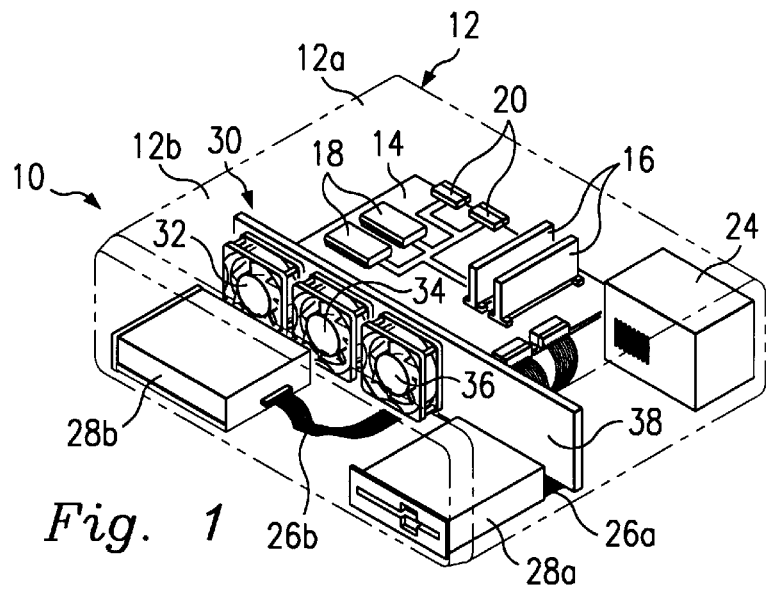
FIG. 1 is a schematic representation of the computer of the present disclosure.

FIG. 1 of the drawings depicts a computer 10 of the present disclosure which can be in the form of desktop computer, a tower computer, or the like. The computer 10 includes a chassis 12 (shown in phantom lines) in which a motherboard, in the form of a printed circuit board, 14 is mounted. Two processors 16, two memories 18, and two input/outputs (I/O) 20 are mounted on the motherboard. A power supply 24 is connected to the motherboard 14, and a pair of cable assemblies 26a and 26b connect the motherboard 14 to a disk drive 28a and a hard drive 28b, respectively.

A fan assembly 30 is mounted to the chassis 12 and extends between the two sidewalls of the chassis, thus dividing the chassis into two sections 12a and 12b. All of the above components with the exception of the drive units 28a and 28b are disposed in the chassis section 12a and the latter drive units are disposed in the chassis section 12b. The fan assembly 30 includes three fans 32, 34, and 36 mounted in a subchassis 38 for drawing air from the chassis section 12b and passing it to the section 12a and over specific components in the latter section, especially including the processor modules 16. In is understood that additional components, buses, electrical traces, electrical circuits and related devices (not shown) are provided in the chassis 10 but are not shown in the interest of clarity.

Figure 2:
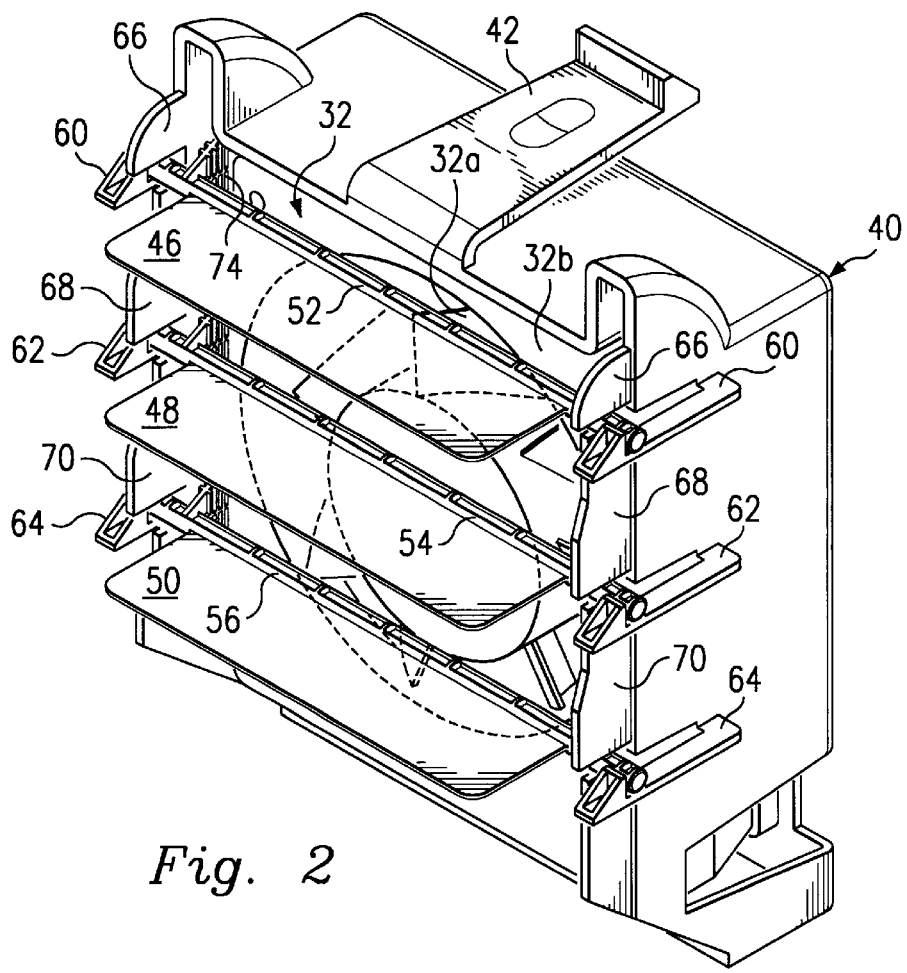
FIG. 2 is a an isometric view of a fan shown in the computer of FIG. 1.

As shown in FIG. 2, the fan 32 includes a propeller blade 32a, a motor (not shown) for driving the blade, and a open-ended housing 32b containing the motor and the blade. Although not shown, it is understood that a finger guard can be provided at one or both ends of the housing 32b. Since the other fans 34 and 36 are identical to the fan 32 they will not be described in detail.

As also shown in FIG. 2, a housing 40 extends around the fan 32, is attached thereto in any known manner, and is also open-ended to allow for the flow of air therethrough as will be described. The housing 40 is not shown in FIG. 1 in the interest of clarity, it being understood that it is mounted to the subchassis 38 (FIG. 1) and, to this end, a flexible tab 42 is provided on the upper portion of the housing to create a spring tension to secure the housing to the subchassis.

Three horizontally extending, vertically spaced louvers 46, 48 and 50 extend across the housing 40 and in the path of air flow through the fan 32. Three horizontally extending shafts 52, 54 and 56 are disposed along the rear edges of the louvers 46, 48, and 50, respectively. As better shown in FIG. 3 in connection with the louver 46 and its corresponding shaft 52, a longitudinal edge of the louver is attached to the shaft along a portion of the shaft extending parallel to the axis of the shaft. The louvers 48 and 50, as well as their corresponding shafts 54 and 56, are constructed in the same manner.

Referring to FIG. 2, three pairs of support brackets 60, 62, and 64 are mounted to the housing 40 with one bracket of each pair being mounted to one side wall of the housing 40, and with the other bracket of each pair being mounted on the other side wall of the housing. The respective end portions of the shafts 52, 54, and 56 are mounted in the pairs of brackets, 60, 62 and 64, respectively, with the symmetrical design of the louvers 46, 48 and 50, along with their respective shafts 52, 54, and 56, enabling either end of each shaft to be inserted into either corresponding support bracket 60, 62, and 64 to facilitate assembly.

As a result of the above, the shafts 52, 54, and 56 can rotate in the support brackets 60, 62, and 64, causing corresponding pivotal movement of the louvers 46, 48 and 50, respectively. Three pair of plates 66, 68 and 70 are mounted on the front edge portion of the sidewalls of the housing 40 immediately above the louvers 46, 48 and 50. The plates 66, 68 and 70 direct the air flow through the fan 32 in a direction along, or parallel to, the axis of the fan, and the louvers 46, 48, and 50 are adapted to close to prevent any backflow of air through the fan in a manner to be described.

Figure 3:
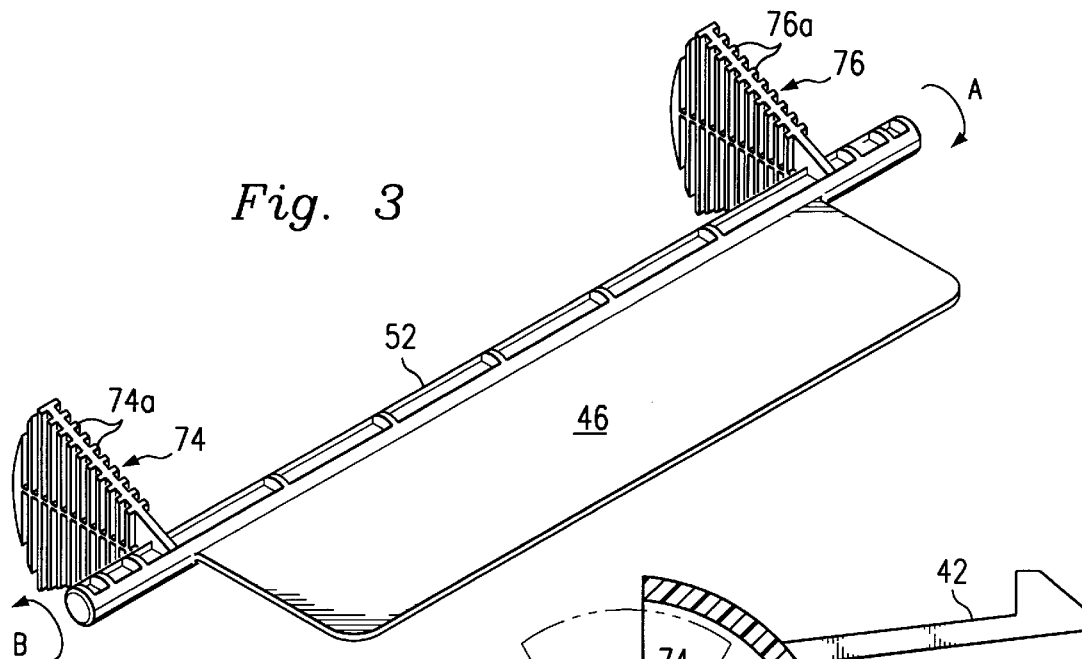
FIG. 3 is an isometric view of a component associated with the fan of FIG. 2.

Referring to FIG. 3, it is noted that the gravitational force caused by the weight of the louver 46 applies a torque, or rotational force to the shaft 52 in the direction indicated by the arrow A in FIG. 3. According to a feature of the disclosure, two counterweights 74 and 76 are mounted to the respective end portions of the shaft 52 at areas diametrically opposed to the area to which the louver 46 is attached. The counterweights 74 and 76 are sized and constructed so that the resultant gravitational force applies a torque, or rotational force, to the shaft 52 in a direction indicated by the arrow B in FIG. 3, which is opposite the direction A. To this end, the counterweights 74 and 76 have a plurality of ribs 74a and 76a to increase the respective masses of the counterweights and thus increase the resulting force.

The design is such that the torque applied to the shaft 52 by the louver 46 is just slightly greater than that applied to the shaft by the counterweights 74 and 76. Therefore, when the fan 32 is inoperable, the louver 46 will pivot down to a vertical position shown by the phantom lines in FIG. 4. When the fan 32 is turned on, the resulting air pressure created by the fan is sufficient to force the louver 46 to its horizontal position shown by the solid lines in FIGS. 2–4. It is understood that identical counterweights are mounted to the respective end portions of the shafts 54 and 56 and, since they function in an identical manner to the counterweights 74 and 76, they will not be described in detail. Therefore the operation of the louvers 48 and 50, as well as their corresponding shafts 54 and 56, are identical to that of the louver 46 and the shaft 52.

Figure 4:
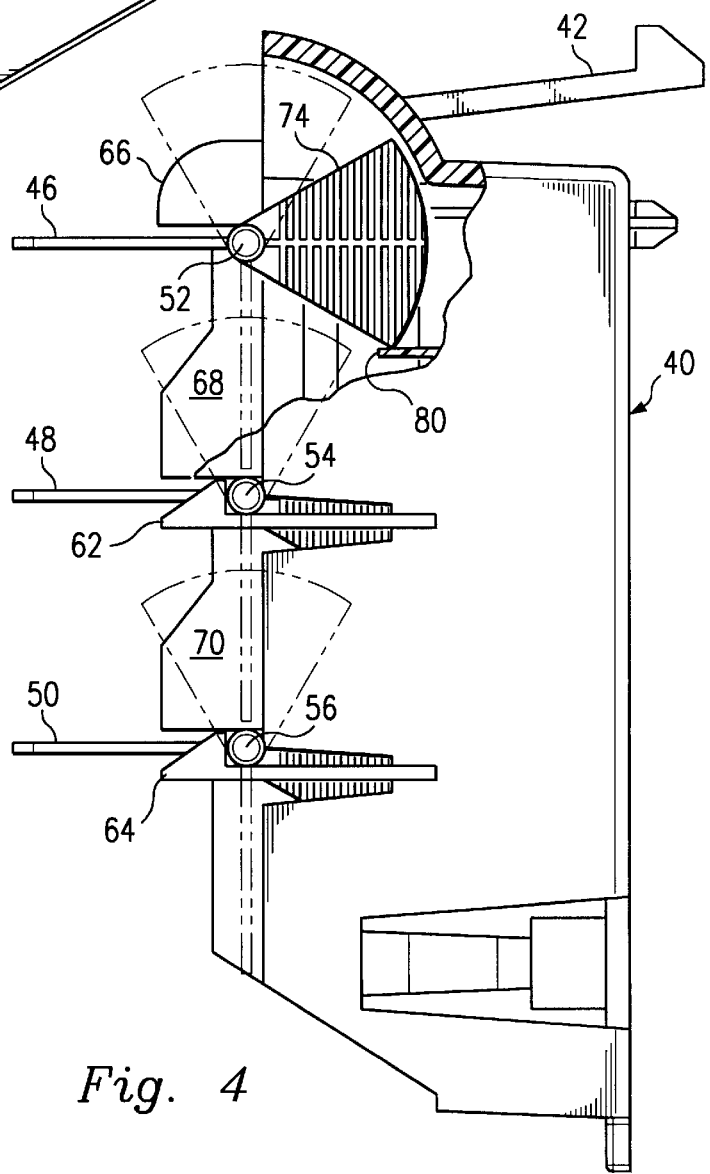
FIG. 4 is a side elevation of the fan of FIG. 2 with a portion being broken away.

As shown in FIG. 4, a stop plate 80 is provided in housing 40 for engagement by the counterweights 74 and 76, for limiting the pivotal movement of the louvers 46 to the horizonal position shown. It is understood that identical stop plates are also provided in the housing 40 for engagement by the counterweights associated with the louvers 48 and 50.

In operation, the fan 32 is not operable when the computer 10 is turned off, in which case the louvers 46, 48, and 50 pivot to their closed, vertical positions shown by the phantom lines in FIG. 4 in response to the gravitational forces acting on the louvers. When the computer 10 is turned on, the fan 32 is activated and, due to the counterweights 74 and 76 acting on the louver 46, as well as the counterweights acting on the louvers 48 and 50, only a slight increase in air pressure caused by the air flow through the fan is needed to pivot the louvers to their horizontal, open positions shown by the solid lines in FIGS. 2–4. This draws the air from the chassis section 12b and forces it through the fan 32 and into the chassis section 12a thus cooling the components in the latter section and especially the processors 16. Since the fans 34 and 36 are identical to the fan 32 and operate in an identical manner, they will not be described in detail.

If the fan 32 should fail, the above-mentioned rotational forces applied to the shafts 52, 54 and 56 by the louvers 46, 48 and 50, respectively causes a corresponding pivotal movement to the louvers to their closed position shown by the phantom lines in FIG. 4. This prevents any backflow of air through the fan 32 that may occur if the louvers 46, 48 and 50 were open and thus eliminates any interference with the normal air flow through the functioning fans 34 and 36. Of course, if the fans 34 and/or 36 should fail, air flow would be prevented in the same manner.

As a result of the foregoing, a distinct advantage is obtained by the system and method of the present disclosure since a single fan failure does not unduly compromise air exchange or directionality of air flow, thereby maintaining effective force-cooling of specified components in the computer 10.

It is understood that variations may be made in the foregoing without departing from the scope of the present disclosure. For example, the number of louvers associated with each fan and the number of fans employed in the fan assembly can be varied within the scope of the disclosure. Also, it is understood that the fan assembly 30 can adapted to pull air from the chassis section 12a and force it into the chassis section 12b. Further, only one fan can even be employed if it is desired to block air flow through the fan in the above manner under certain conditions. Other modifications, changes and substitutions are intended in the foregoing disclosure and in some instances some features of the disclosure will be employed without a corresponding use of other features. Accordingly, it is appropriate that the appended claims be construed broadly and in a manner consistent with the scope of the disclosure.

What is claimed is:

1. A computer comprising:

at least one chassis;

a plurality of components disposed in the chassis;

a plurality of fans disposed in the chassis;

at least one horizontally extending shaft mounted for rotation relative to each fan;

a louver having a longitudinal edge connected along the length of each shaft for rotation therewith between:

a horizontal open position in response to the air pressure established by the fan in which the louver permits air flow through the fan to distribute air over at least one of the components, and a vertical closed position under the force of gravity when the fan is inoperable in which the louver blocks air flow through the fan; and at least one counterweight attached to an area of each shaft diametrically opposite the portion of the shaft to which the louver is attached for establishing a force that counteracts a portion of the gravitational force on each louver to reduce the amount of air pressure required to open the louver.

2. The computer of claim 1 further comprising at least one stop member disposed on the fan for engagement by the member at the open position of the louver.

3. The computer of claim 1 further comprising a pair of spaced support brackets attached to the fan for receiving the respective ends of the shaft, wherein the longitudinal edge of the louver is attached to the shaft along a portion of the shaft extending parallel to the axis of the shaft so that either end of the shaft can be mounted in either of the support brackets.

4. The computer of claim 1 wherein there are a plurality of louvers pivotally mounted to the fan and extending parallel to each other.

5. The computer of claim 1 wherein there are two fans, and wherein, upon failure of one fan, the louver associated with the one fan blocks the flow of air through the one fan so that it will not interfere with the flow of air through the other fan.

6. A cooling system for an electronic device having at least one chassis and a plurality of components disposed in the chassis, the cooling system comprising:

a plurality of fans disposed in the chassis;

at least one horizontally extending shaft mounted for rotation relative to each fan;

a louver having a longitudinal edge connected along the length of each shaft for rotation therewith between:

a horizontal open position in response to the air pressure established by the fan in which the louver permits air flow through the fan to distribute air over at least one of the components, and a vertical closed position under the force of gravity when the fan is inoperable in which the louver blocks air flow through the fan; and a counterweight attached to an area of each shaft diametrically opposite the portion of the shaft to which the louver is attached for establishing a force that counteracts at least a portion of the gravitational force on each louver to reduce the amount of air pressure required to open the louver.

7. The system of claim 6 further comprising at least one stop member disposed on the fan for engagement by the member at the open position of the louver.

8. The system of claim 6 further comprising a pair of spaced support brackets attached to the fan for receiving the respective ends of the shaft, wherein the longitudinal edge of the louver is attached to the shaft along a portion of the shaft extending parallel to the axis of the shaft so that either end of the shaft can be mounted in either of the support brackets.

9. The system of claim 6 wherein there are a plurality of louvers pivotally mounted to the fan and extending parallel to each other.

10. The system of claim 6 wherein there are two fans, and wherein, upon failure of one fan, the louver associated with the one fan blocks the flow of air through the one fan so that it will not interfere with the flow of air through the other fan.

* * * * *